United States Patent
Hsiao et al.

(10) Patent No.: US 7,550,336 B2
(45) Date of Patent: Jun. 23, 2009

(54) METHOD FOR FABRICATING AN NMOS TRANSISTOR

(75) Inventors: Tsai-Fu Hsiao, Hsin-Chu (TW);
Po-Yuan Chen, Kao-Hsiung Hsien (TW); Jung-Chin Chen, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 85 days.

(21) Appl. No.: 11/562,402

(22) Filed: Nov. 21, 2006

(65) Prior Publication Data

US 2007/0122987 A1 May 31, 2007

Related U.S. Application Data

(60) Provisional application No. 60/597,338, filed on Nov. 25, 2005.

(51) Int. Cl.
*H01L 21/8238* (2006.01)
*H01L 21/36* (2006.01)
*H01L 21/20* (2006.01)

(52) U.S. Cl. .............. 438/199; 438/478; 438/514; 438/758; 257/E21.055; 257/E21.057; 257/E21.634

(58) Field of Classification Search .......... 438/142, 438/151, 514, 478, 758, 765, 766; 257/E21.057, 257/E21.055, E21.054, E21.634
See application file for complete search history.

(56) References Cited

U.S. PATENT DOCUMENTS

| | | | | |
|---|---|---|---|---|
| 6,551,886 | B1* | 4/2003 | Yu | 438/300 |
| 6,621,131 | B2* | 9/2003 | Murthy et al. | 257/408 |
| 6,861,318 | B2* | 3/2005 | Murthy et al. | 438/299 |
| 6,881,635 | B1* | 4/2005 | Chidambarrao et al. | 438/300 |
| 7,217,608 | B1* | 5/2007 | Xiang | 438/199 |
| 2004/0262694 | A1* | 12/2004 | Chidambaram | 257/369 |
| 2005/0112835 | A1* | 5/2005 | Sa | 438/305 |
| 2006/0105511 | A1* | 5/2006 | Yang et al. | 438/197 |
| 2006/0115940 | A1* | 6/2006 | Kim et al. | 438/197 |
| 2006/0134872 | A1* | 6/2006 | Hattendorf et al. | 438/300 |
| 2006/0234455 | A1* | 10/2006 | Chen et al. | 438/276 |
| 2007/0037326 | A1* | 2/2007 | Chen et al. | 438/151 |
| 2007/0238262 | A1* | 10/2007 | Summers | 438/455 |

* cited by examiner

*Primary Examiner*—Walter L Lindsay, Jr.
*Assistant Examiner*—Mohsen Ahmadi
(74) *Attorney, Agent, or Firm*—Winston Hsu

(57) ABSTRACT

A method for fabricating an NMOS transistor is disclosed. First, a substrate having a gate structure thereon is provided. A carbon implantation process is performed thereafter by implanting carbon atoms into the substrate for forming a silicon carbide region in the substrate. Subsequently, a source/drain region is formed surrounding the gate structure. By conducting a carbon implantation process into the substrate and a corresponding amorphized implantation process before or after the carbon implantation process is completed, the present invention eliminates the need of forming a recess for accommodating an epitaxial layer composed of silicon carbide while facilitates the formation of silicon carbide from the combination of both implantation processes.

18 Claims, 12 Drawing Sheets

METHOD FOR FABRICATING AN NMOS TRANSISTOR

CROSS REFERENCE TO RELATED APPLICATIONS

This application claims the benefit of the filing date of U.S. Provisional Patent Application No. 60/597,338, filed Nov. 25, 2005, the contents of which are hereby incorporated by reference.

BACKGROUND OF THE INVENTION

1. Field of the Invention

The invention relates to a method for fabricating an NMOS transistor.

2. Description of the Prior Art

Both theoretical and empirical studies have demonstrated that carrier mobility in a transistor can be greatly increased when a stress of sufficient magnitude is applied to the conduction channel of a transistor to create a strain therein. Stress is defined as force per unit area. Strain is a dimensionless quantity defined as the change in a particular dimension of an item: for example, the change in the item's length, versus the initial dimension of that item: for example, its original length, when a force is applied in the direction of that dimension of the item: for example, in the direction of the length of the item's length. Strain can be either tensile or compressive. In p-type metal oxide semiconductors (PMOS), the application of a compressive longitudinal stress, i.e. in the direction of the length of the conduction channel, creates a strain in the conduction channel which is known to increase the drive current of a PMOS transistor. However, if that same stress is applied to the conduction channel of an NMOS transistor, its drive current decreases.

It has been proposed to increase the performance of an NMOS and a PMOS by applying a tensile longitudinal stress to the conduction channel of an NMOS and applying a compressive longitudinal stress to the conduction channel of a PMOS. Such proposals have focused on masked processes involving the masking of a PMOS portion of the chip and altering the materials used in shallow trench isolation regions near the conduction channel of the PMOS to apply a desired stress thereto. Separate steps would then be performed to mask the NMOS portion of the chip and alter the materials used in shallow trench isolation regions near the conduction channels of the NMOS to apply a desired stress thereto. Other proposals have involved masked processed centered on modulating intrinsic stresses present in spacer features.

Silicon germanium is a desirable lattice-mismatched semiconductor for use in forming strained silicon transistor channels. A strain is created when a second semiconductor is grown onto a single-crystal of a first semiconductor when the two semiconductors are lattice-mismatched to each other.

Silicon germanium grows epitaxially on silicon having a crystal structure aligned with the silicon crystal structure. However, because silicon germanium normally has a larger crystal structure than silicon, the epitaxially grown silicon germanium becomes internally compressed, and results in improved hole mobility, which improves the performance of a PMOS transistor.

In other proposals using strained silicon, an epitaxial layer composed of silicon carbide is grown on the silicon substrate. Since silicon carbide has a smaller crystal structure than silicon, the epitaxially grown silicon carbide layer will produce a tensile strain on the silicon substrate. This results in improved electron mobility, which improves the performance of an NMOS transistor.

Please refer to FIGS. 1 through 5. FIGS. 1 through 5 illustrate a method for fabricating an NMOS transistor according to the prior art. As shown in FIG. 1, a substrate 10 having a gate structure 12 thereon is provided. The substrate 10 is preferably a wafer or a silicon on insulator (SOI) substrate, and the gate structure 12 is composed of a gate dielectric 14 and a gate 16. An offset spacer 18 is formed on the sidewall of the gate structure 12, and a shallow trench isolation 20 is formed surrounding the region outside the active area of the transistor.

As shown in FIG. 2, a pre-amorphorized implantation (PAI) process is performed thereafter with antimony (Sb) or germanium (Ge) to damage the silicon lattice of the substrate 10 for forming an amorphorized region 22 at two sides of the gate structure 12. Next, an etching process is performed by using the gate structure 12 as a mask to form a recess (not shown) at two sides of the gate structure 12 in the substrate 10, and a selective epitaxial growth (SEG) process is performed to form an epitaxial layer (not shown) composed of silicon carbide in the recess.

After the selective epitaxial growth process is completed, as shown in FIG. 3, an ion implantation process is performed to implant an n-type dopant into the substrate 10, and a rapid thermal annealing process is performed thereafter to form a lightly doped drain (LDD) 26 at two sides of the gate structure 12.

After the lightly doped drain 26 is formed, as shown in FIG. 4, a spacer 28 is formed on the sidewall of the gate structure 12. Subsequently, as shown in FIG. 5, another ion implantation process is performed to implant n-type dopant into the substrate 10 at two sides of the spacer 28 for forming a source/drain region 30, thus complete the fabrication of an NMOS transistor.

However, as noted above, a pre-amorphorized implantation process is performed prior to the selective epitaxial growth by injecting atoms such as antimony or germanium into the silicon substrate for damaging the lattice structure of the substrate. Since germanium or antimony used during the amorphorizing step is larger than silicon, these large atoms will often cause compensated stress for the carbon atoms deposited during the epitaxial growth process, thus producing an interstitial defect in the silicon substrate and inhibiting the formation of silicon carbide. The inhibition of silicon carbide ultimately reduces the tensile strain required for the NMOS transistor and thus reducing the performance of the transistor accordingly.

SUMMARY OF THE INVENTION

It is an objective of the present invention to provide a method for fabricating an NMOS transistor for solving the aforementioned problem.

A method for fabricating an NMOS transistor is disclosed. First, a substrate having a gate structure thereon is provided. A carbon implantation process is performed thereafter by implanting carbon atoms into the substrate for forming a silicon carbide region in the substrate. Subsequently, a source/drain region is formed at two sides of the gate structure.

By conducting a carbon implantation process into the substrate and a corresponding amorphorized implantation process before or after the carbon implantation process is completed, the present invention eliminates the need of forming a recess for accommodating an epitaxial layer composed of silicon carbide while facilitates the formation of silicon carbide from the combination of both implantation processes. Preferably, by injecting atoms smaller than silicon into the substrate during the amorphorized implantation process, the present invention is able to prevent phenomenon such as interstitial defects in the polysilicon substrate, which is commonly caused by using larger atoms such as germanium as an amorphorized implant. Additionally, by using smaller atoms such as carbon or argon to disorder the polysilicon substrate, the formation of silicon carbide can be facilitated and the tensile strain required for the NMOS transistor can be achieved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
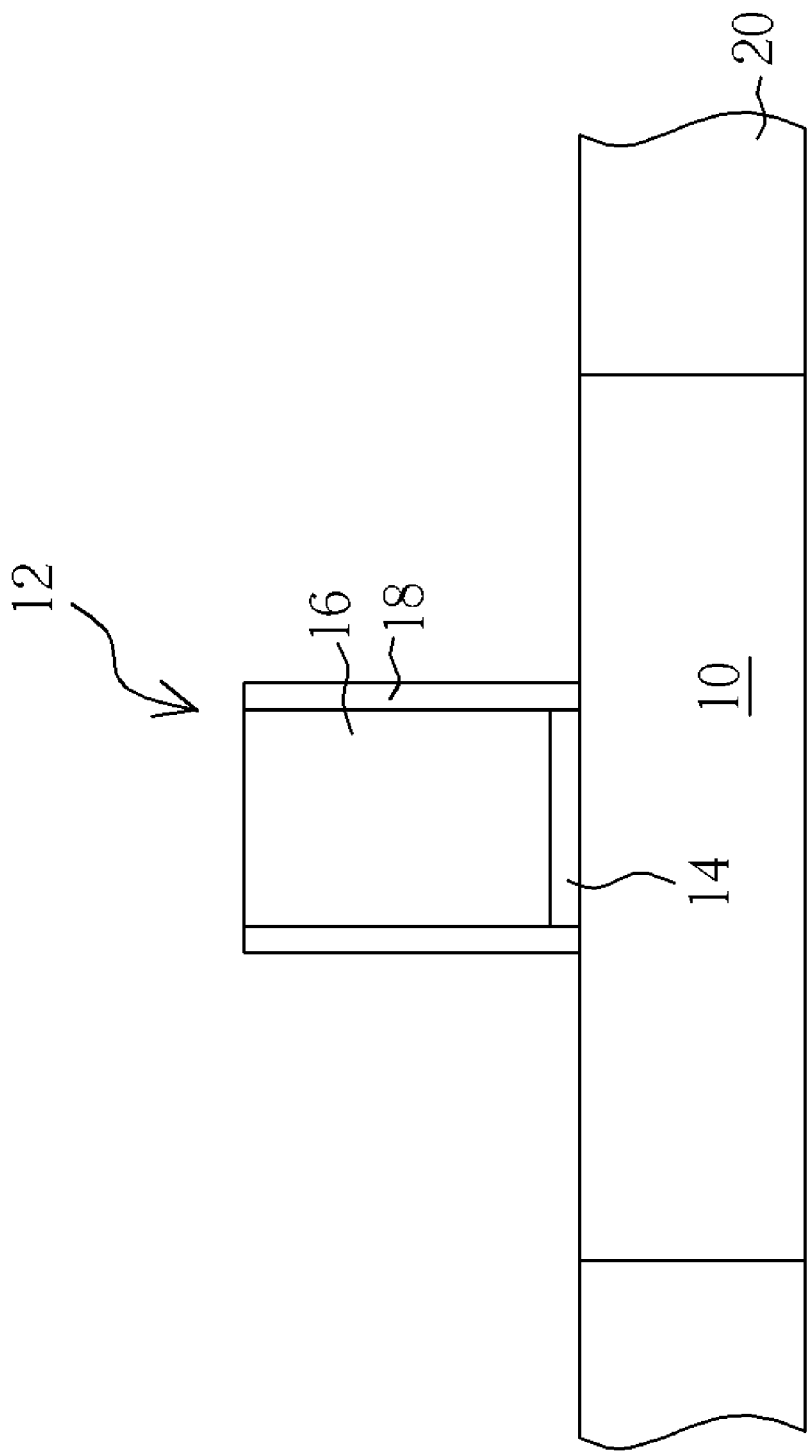
FIGS. 1 through 5 illustrate a method for fabricating an NMOS transistor according to the prior art.
Figure 2:
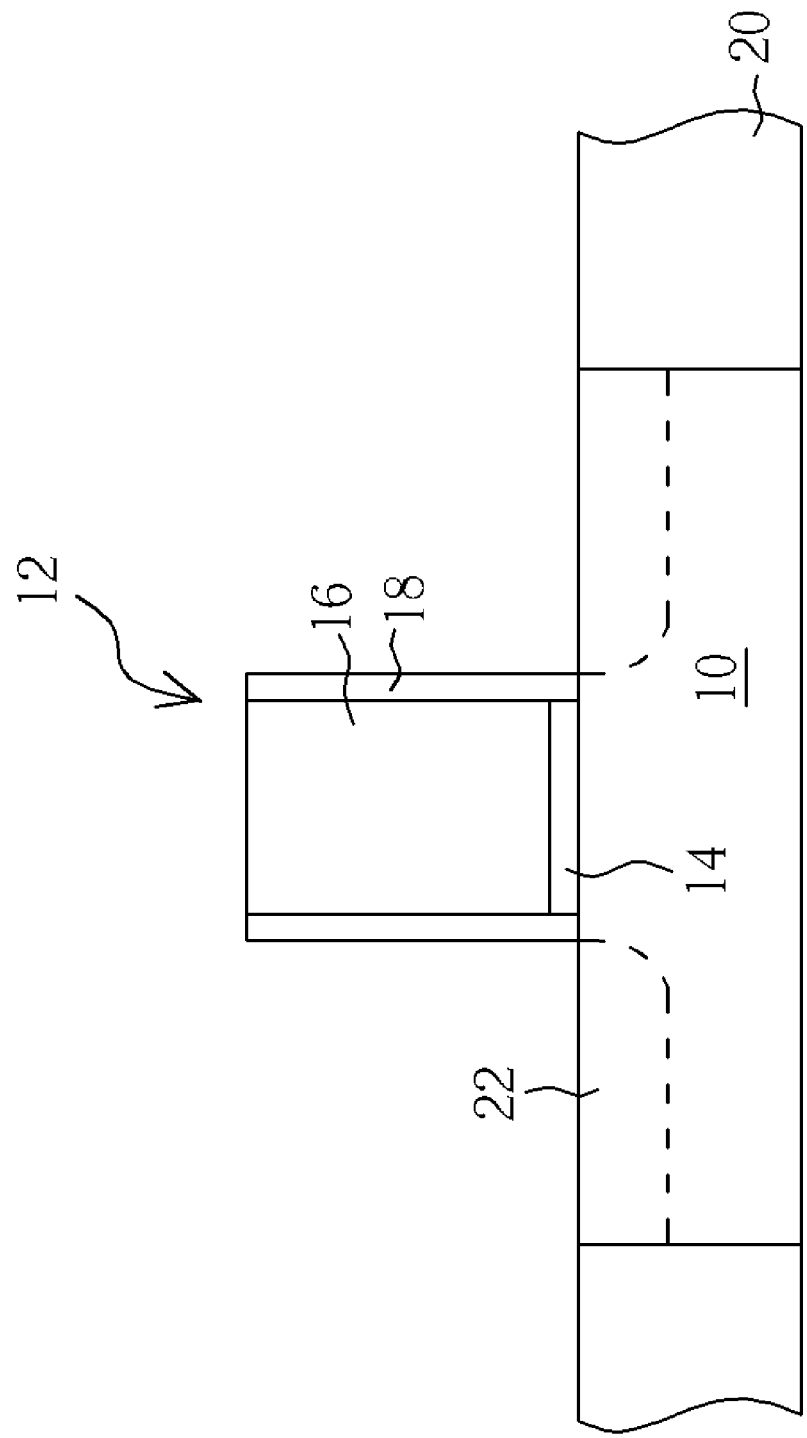
Figure 3:
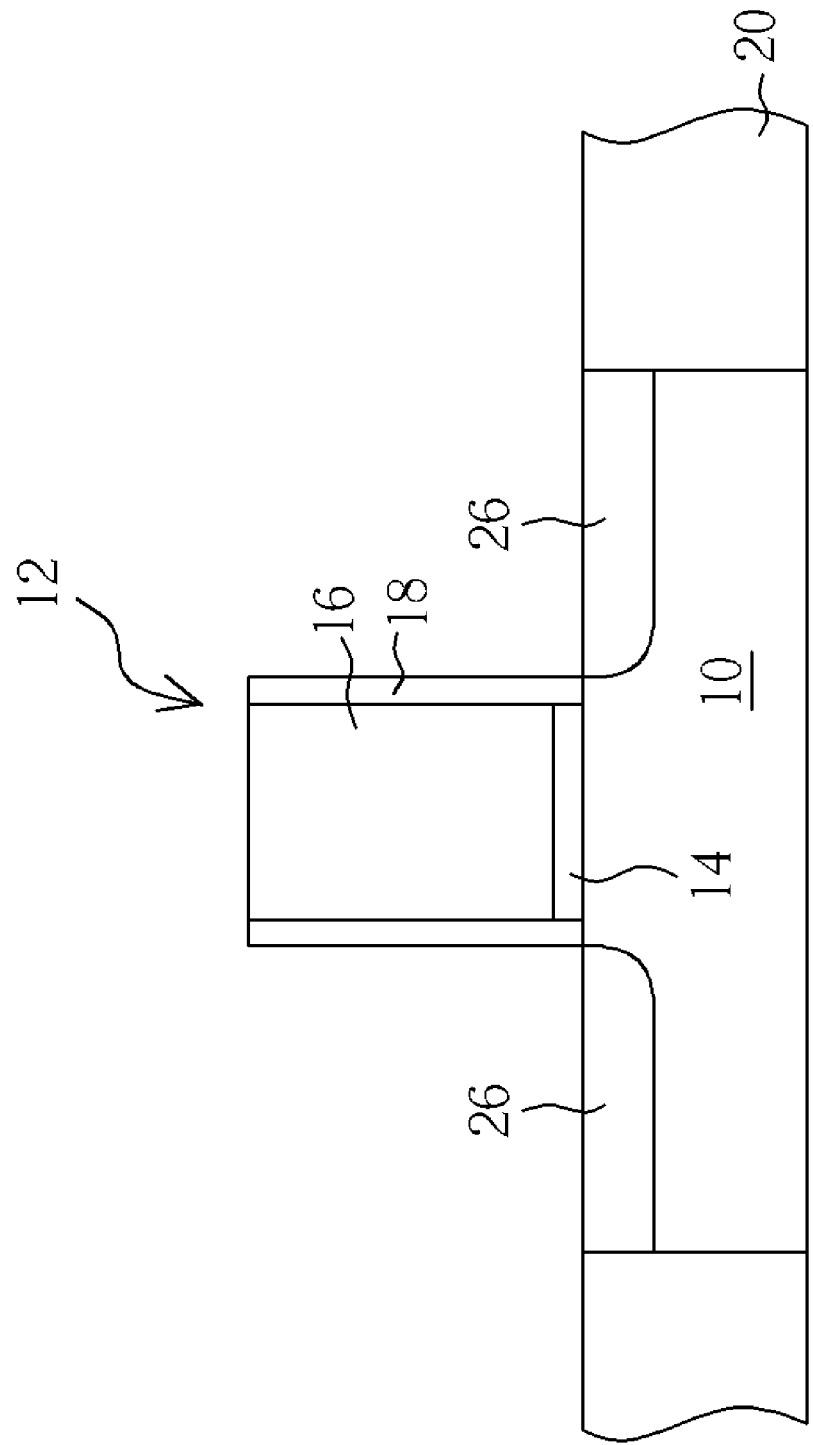
Figure 4:
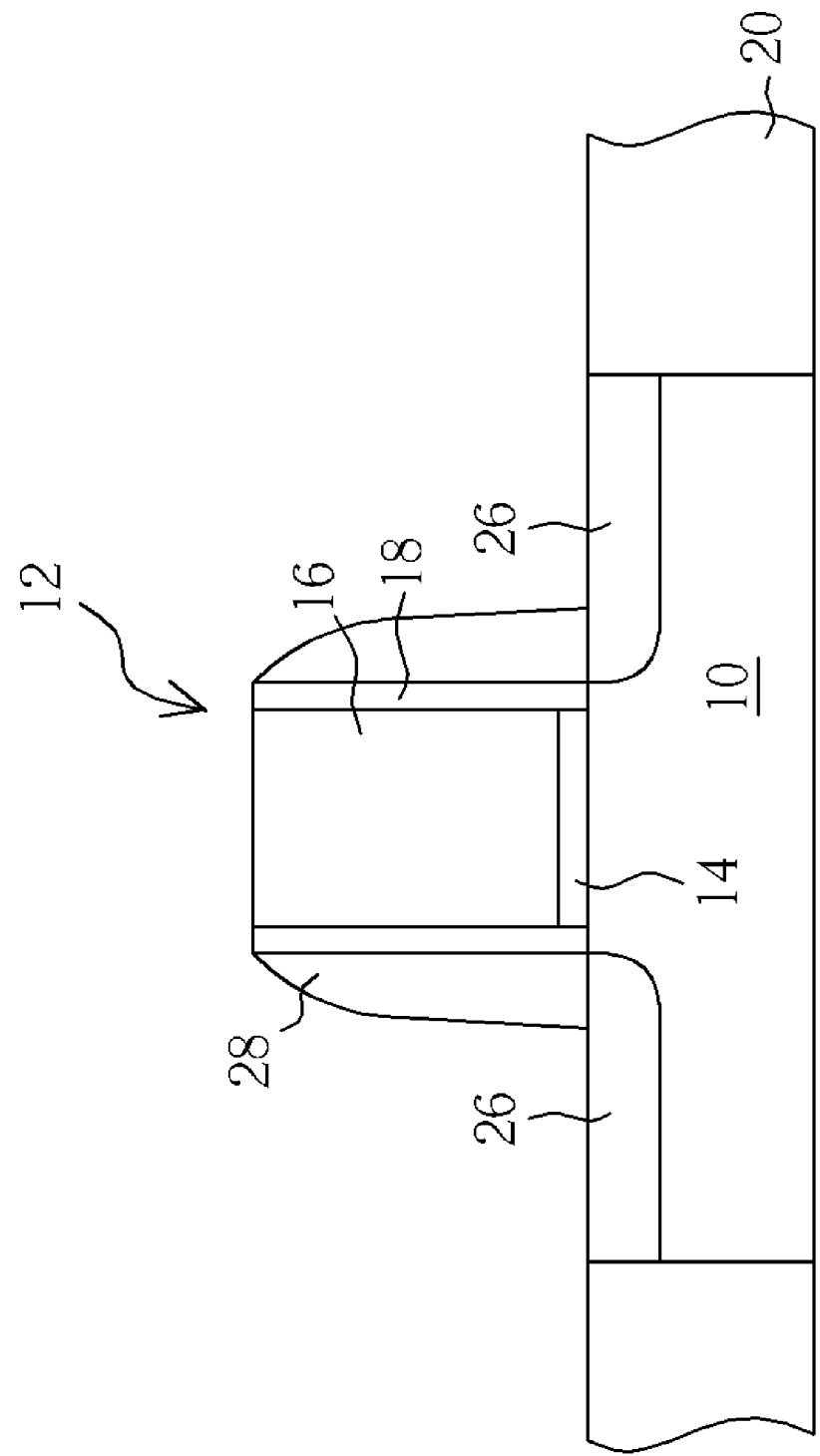
Figure 5:
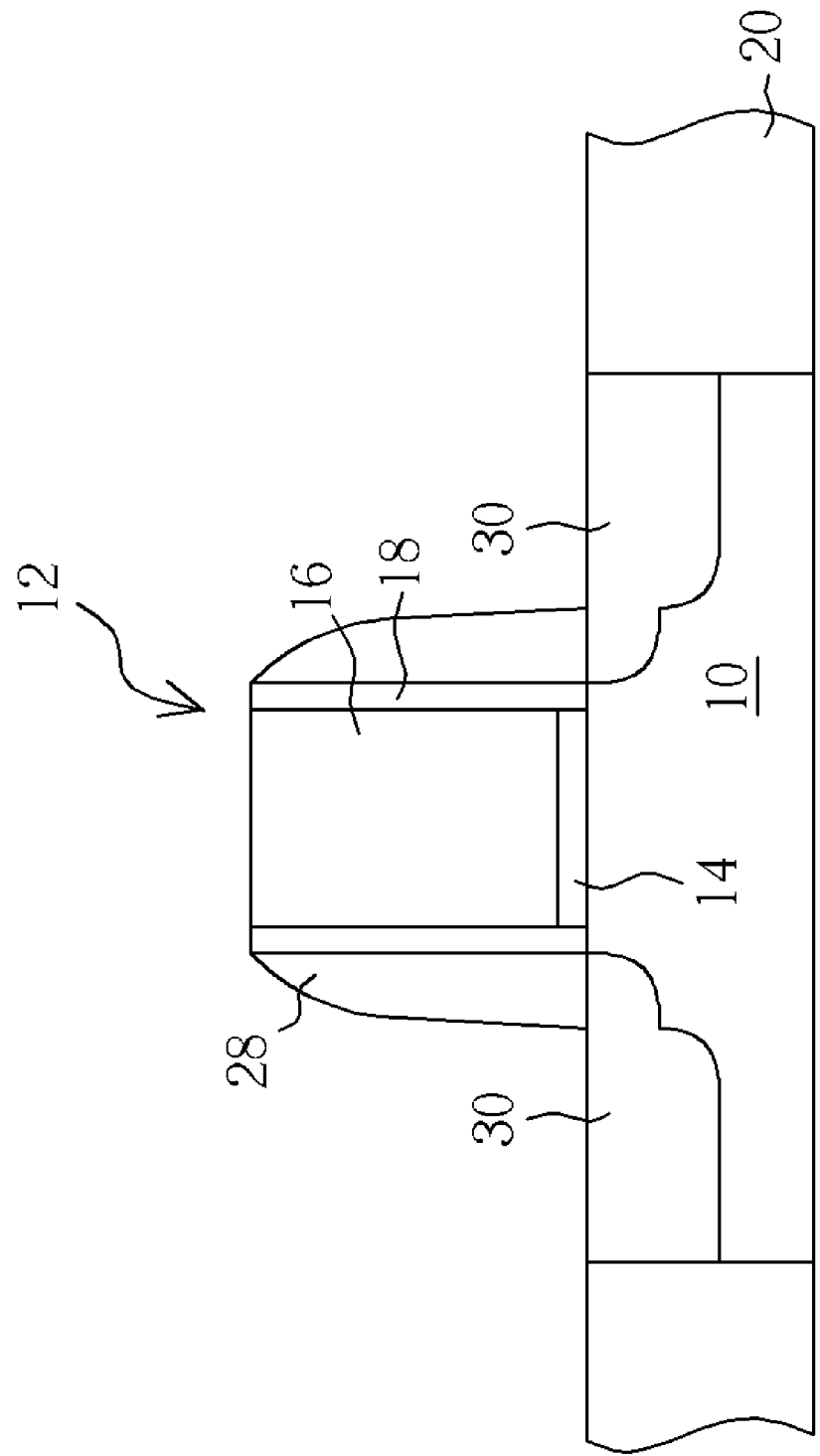
Figure 6:
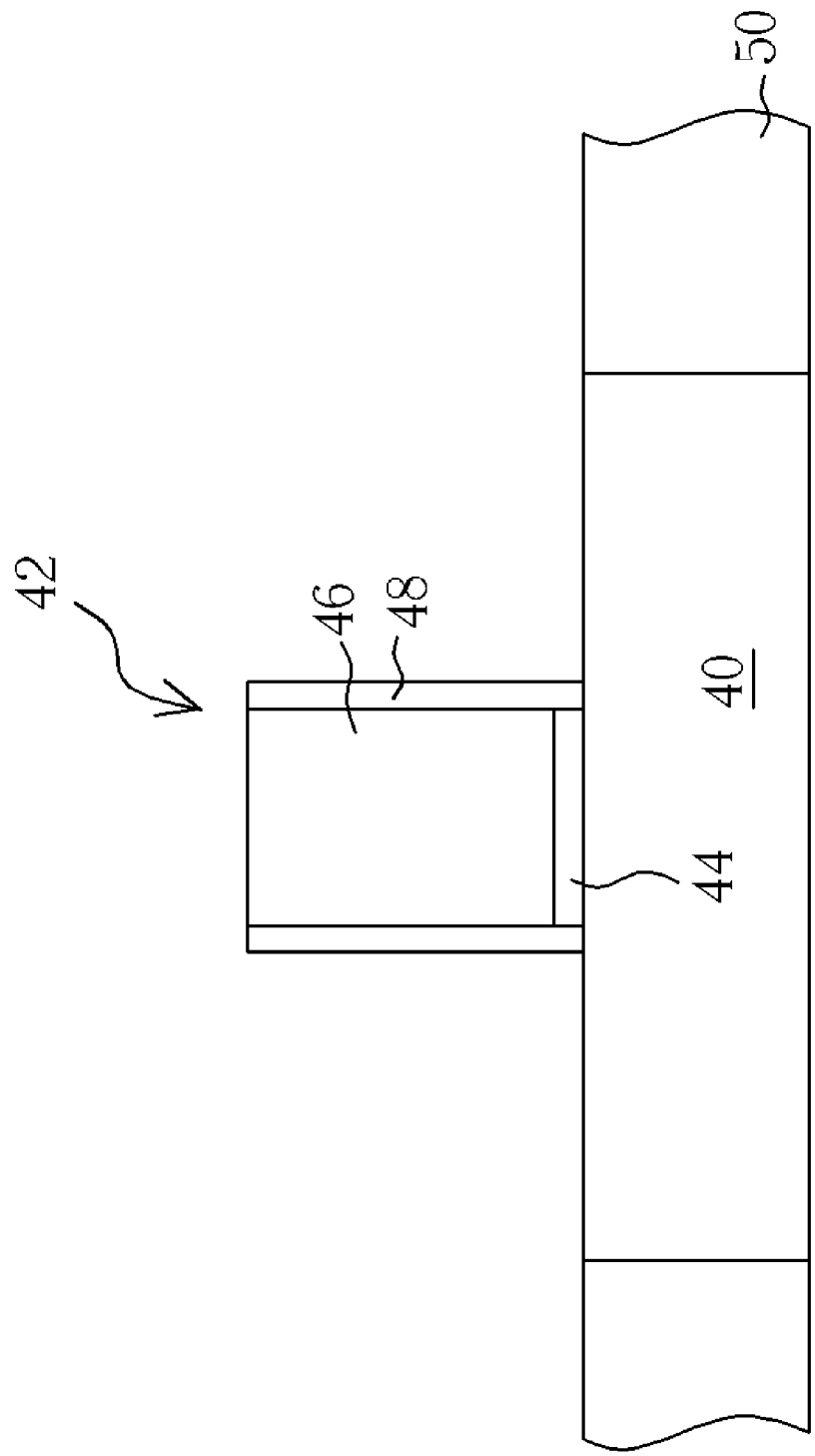
FIGS. 6 through 11 illustrate a method for fabricating an NMOS transistor according to the present invention.

Please refer to FIGS. 6 through 11. FIGS. 6 through 11 illustrate a method for fabricating an NMOS transistor according to the present invention. As shown in FIG. 6, a substrate 40 having a gate structure 42 thereon is provided. The substrate 40 is preferably a wafer or a silicon on insulator (SOI) substrate, and the gate structure 42 is composed of a gate dielectric 44 and a gate 46. An offset spacer 48 is formed on the sidewall of the gate structure 42, and a shallow trench isolation 50 is formed surrounding the region outside the active area of the NMOS transistor.

Figure 7:
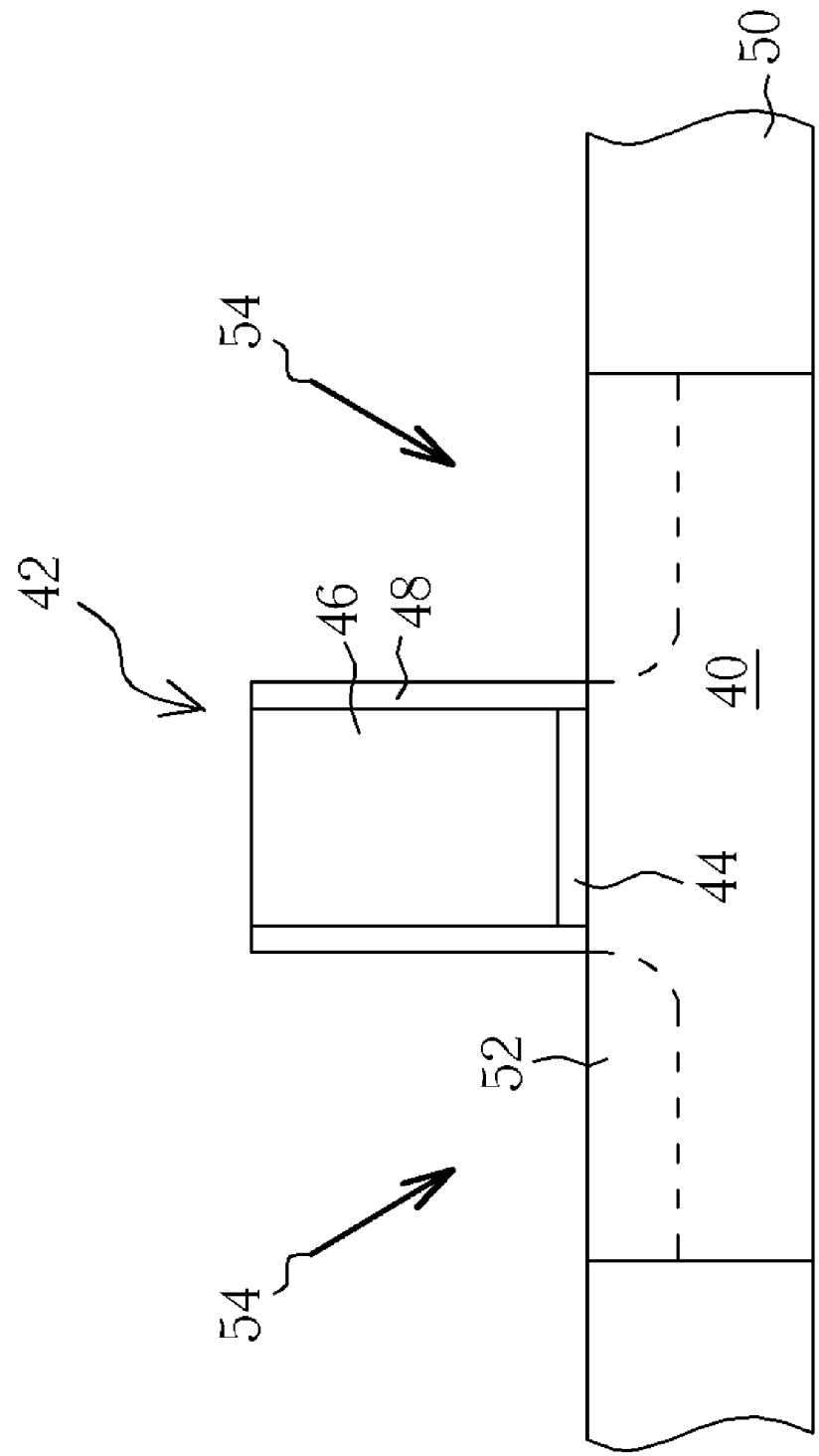

As shown in FIG. 7, an amorphorized implantation process is performed with atoms smaller than silicon to disorder the polysilicon lattice of the substrate 40 for forming an amorphorized region 52 at two sides of the gate structure 12. According to the preferred embodiment of the present invention, the implant species used for the amorphorized implantation may include any atom smaller than silicon, such as carbon, helium, neon, argon, or nitrogen. Additionally, the energy of the amorphorized implantation process is between 2 KeV to 40 KeV, and the concentration of the implant is between $1\times10^{14}$ atom percent to $1\times10^{16}$ atom percent. Thereafter, an annealing process is performed to re-crystallize the amorphorized state of the substrate 40, in which the temperature used for the re-crystallize annealing process is preferably between 500° C. to 1100° C.

Next, a carbon implantation process 54 is conducted by implanting carbon atoms into the substrate 40, such that the implanted carbon atoms will react with the amorphorized portion of the substrate 40 to form a silicon carbide region (not shown). The carbon implantation process 54 is performed with a carbon concentration between 0% to 20%, or preferably with a concentration of 5%. In most circumstances, the carbon atoms implanted into the substrate are grouped into clusters and are difficult to be positioned accordingly. It should be noted that by injecting atoms smaller than silicon into the substrate 40 via the amorphorized implantation process described above, the present invention would prevent the gathering of carbon atoms implanted during the carbon implantation process, thus reducing the interstitial defect caused by the conventional technique of using germanium as an implant source, and facilitating the formation of silicon carbide in the substrate. The resulting silicon carbide would produce a tensile strain with respect to the channel region of the NMOS transistor and ultimately increase the performance of the transistor.

After the carbon implantation process is completed, a pocket implantation can be conducted to form a pocket dopant region (not shown) between the amorphorized region 52 and the substrate 40. The pocket implantation process can be used for inhibiting irregular punch-through phenomenon during the fabrication process.

Figure 8:
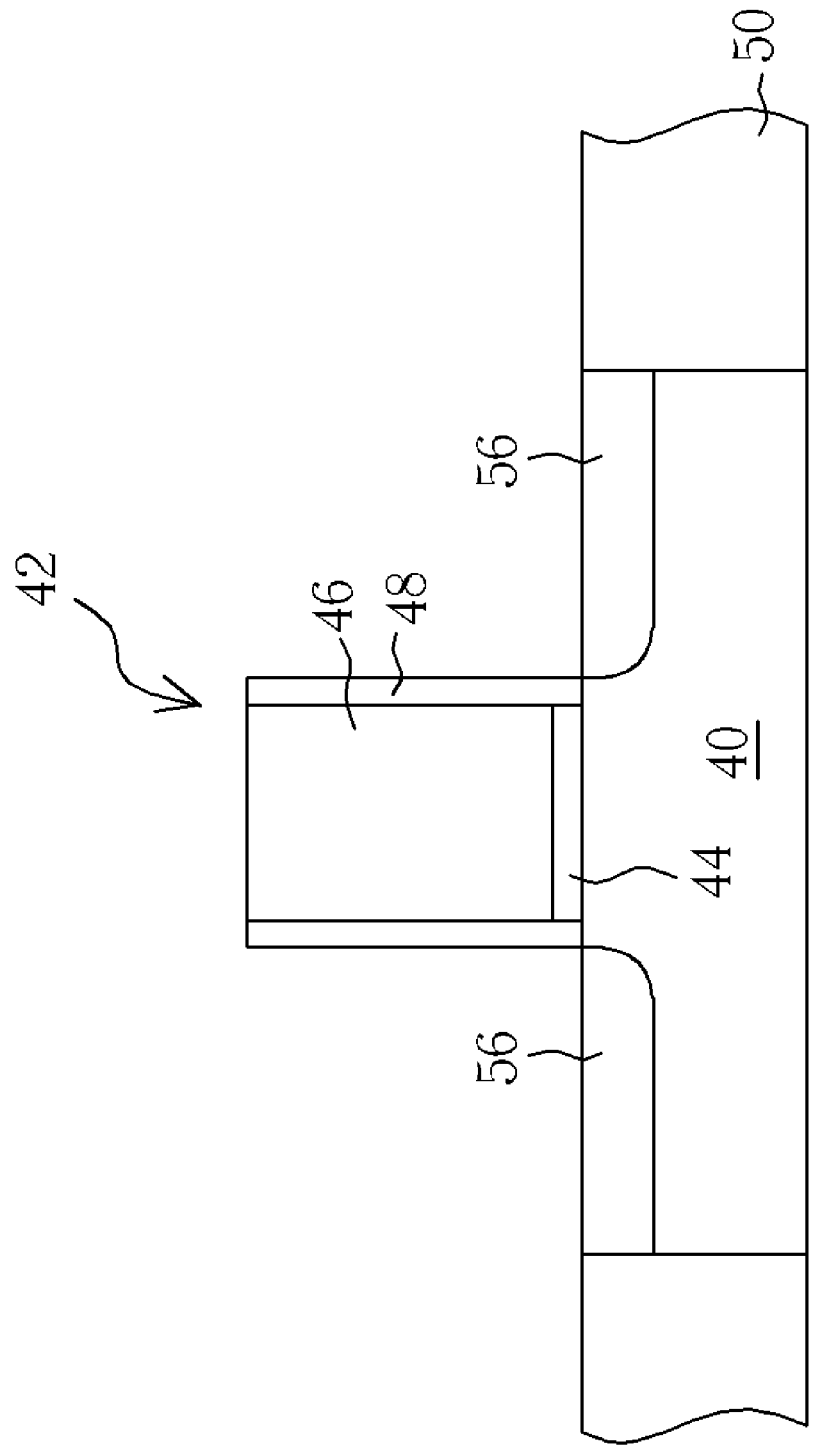

As shown in FIG. 8, an ion implantation process is performed by implanting an n-type dopant into the substrate 40, and a rapid thermal annealing process is performed thereafter to form a lightly doped drain (LDD) 56 at two sides of the gate structure 42.

Figure 9:
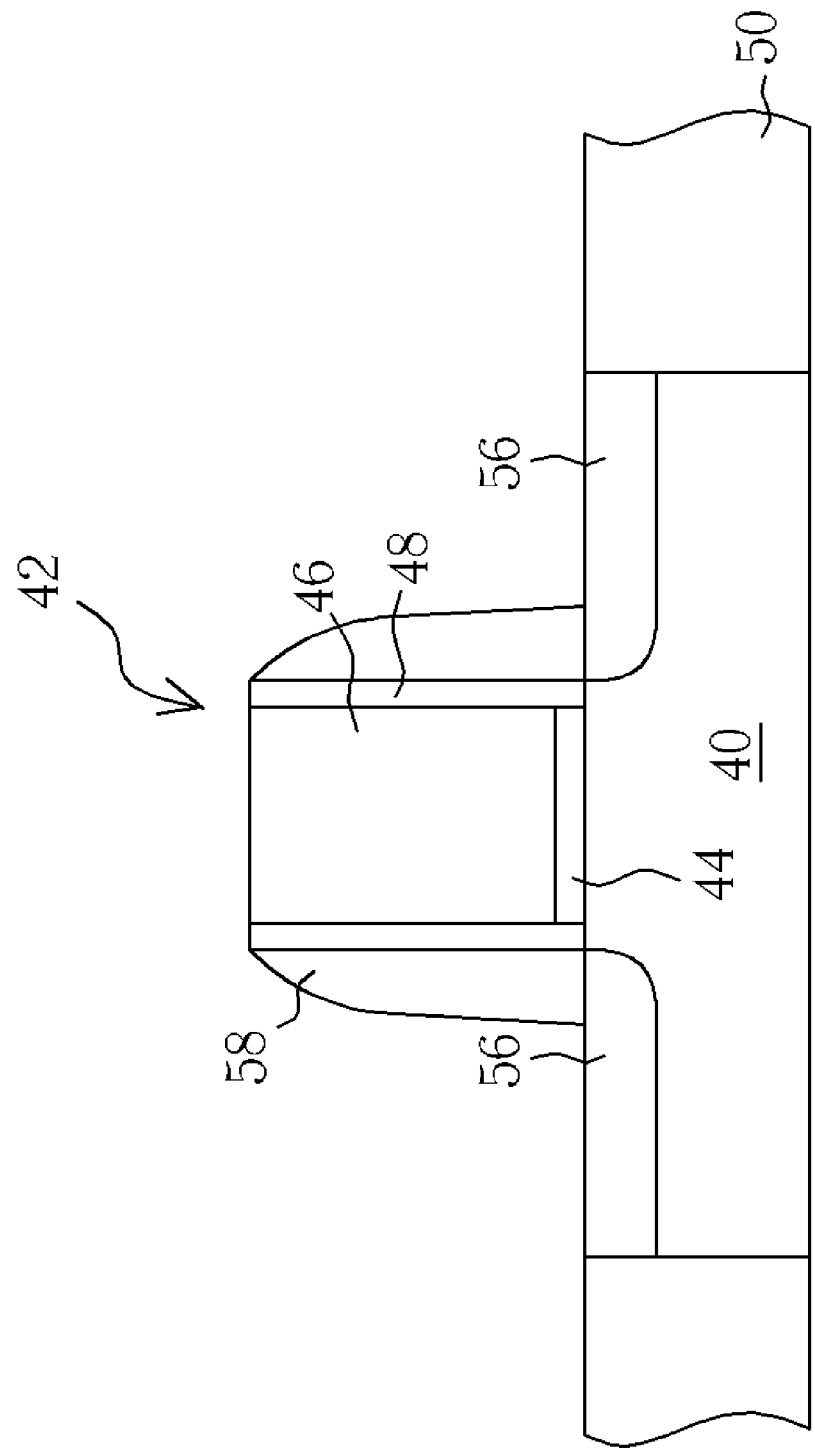

After the lightly doped drain 56 is formed, as shown in FIG. 9, a spacer 58 is formed on the sidewall of the gate structure 42. Another amorphorized implantation process can be conducted thereafter by implanting atoms smaller than silicon into the substrate for disrupting the polysilicon structure of the substrate with respect to the source/drain region formed in the later process.

Figure 10:
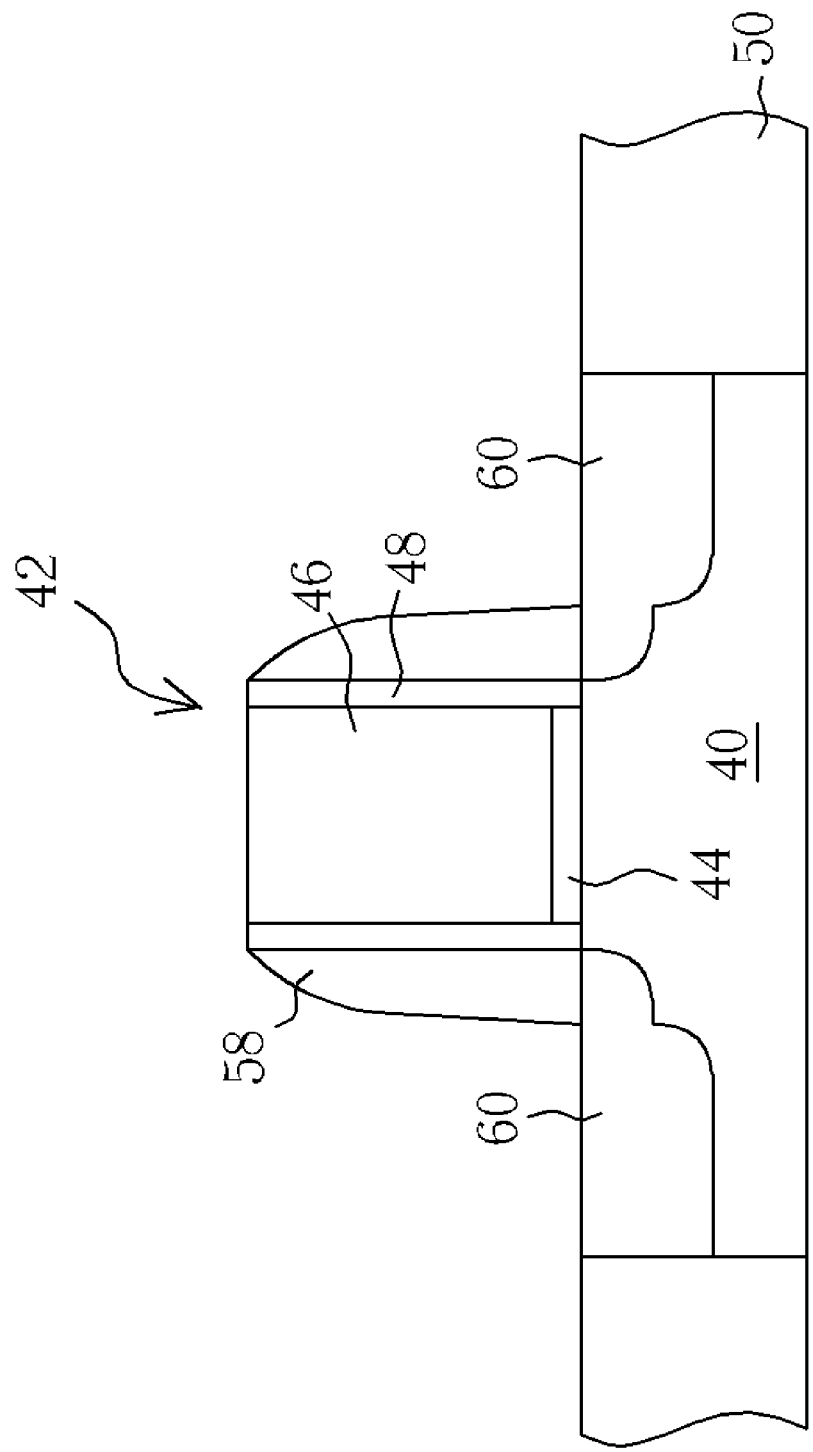

Subsequently, as shown in FIG. 10, another ion implantation process is performed by implanting n-type dopant into the substrate 40 at two sides of the spacer 58, and a rapid thermal annealing process is performed to activate the dopant in the substrate 40 for forming a source/drain region 60. This completes the fabrication of a typical NMOS transistor.

Figure 11:
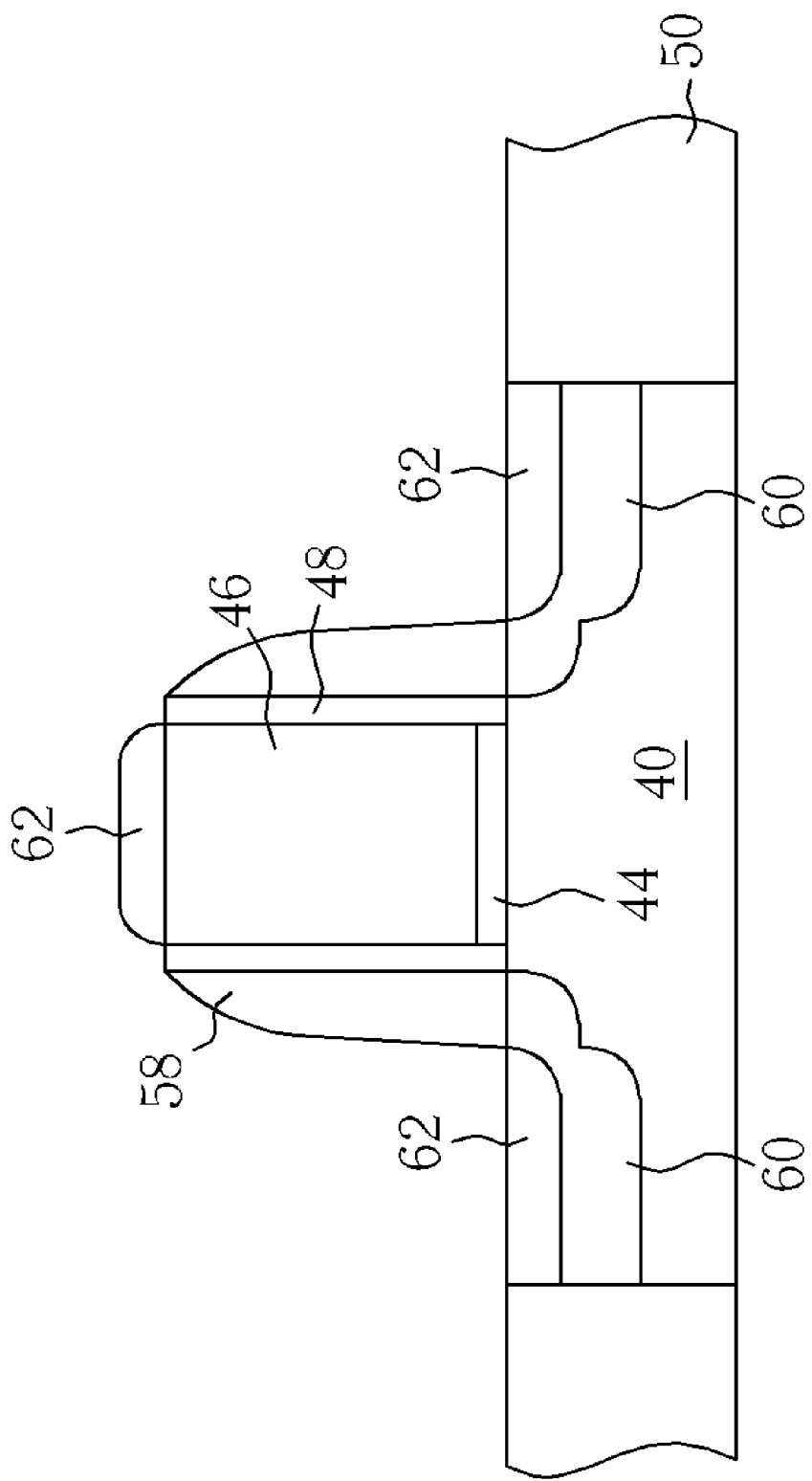

Thereafter, as shown in FIG. 11, a metal layer (not shown) composed of nickel silicide can be disposed on the NMOS transistor, and a rapid thermal annealing process is conducted to form a salicide layer 62 atop the gate 46 and the source/drain region 60 of the transistor. The un-reacted metal layer is removed thereafter.

Figure 12:
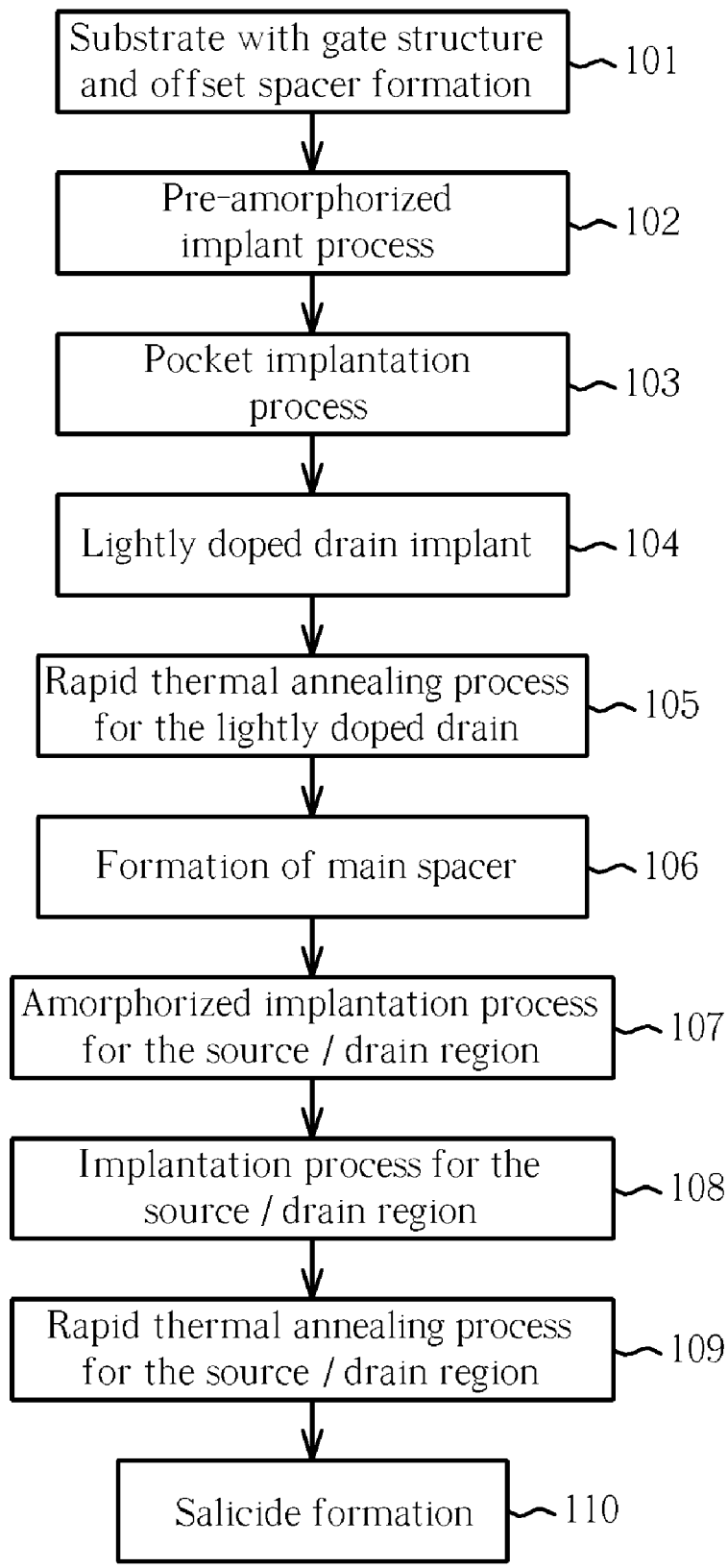
FIG. 12 is a flowchart illustrating a process flow for fabricating an NMOS transistor according to the present invention.

According to an embodiment of the present invention, the aforementioned carbon implantation process and the amorphorized implantation process can be conducted between any two of the fabrication steps described above. Please refer to FIG. 12. FIG. 12 is a flowchart illustrating a process flow for fabricating an NMOS transistor according to the present invention. The fabrication of the NMOS transistor of the present invention includes the following steps.

Step 101: Providing a substrate composed of polysilicon, in which the substrate includes a gate structure and an offset spacer thereon.

Step 102: Performing a pre-amorphorized implantation process by injecting atoms smaller than silicon into the substrate for forming an amorphorized region and damaging the lattice structure of the polysilicon substrate.

Step 103: Performing a selective pocket implantation process in the region between the amorphorized region and the undisrupted substrate.

Step 104: Performing an ion implantation by implanting an n-type dopant into the substrate.

Step 105: Performing a rapid thermal annealing process to activate the implanted dopant for forming a light doped drain.

Step 106: Forming a spacer on the sidewall of the gate structure.

Step 107: Performing an amorphorized implantation process by injecting atoms such as carbon into the source/drain region of the substrate.

Step 108: Performing an ion implantation by implanting an n-type dopant into the substrate.

Step 109: Performing a rapid thermal annealing process to activate the implanted dopant for forming a source/drain region.

Step 110: Depositing a metal layer composed of nickel silicide on the NMOS transistor, and performing a rapid thermal annealing process to form a salicide layer on the gate structure and the source/drain region of the transistor.

It should be noted that the carbon implantation process of the present invention can be inserted between any of the two steps listed above, such as between step 1 and step 2, step 2 and step 3, step 3 and step 4, step 4 and step 5, step 5 and step 6, step 6 and step 7, step 7 and step 8, step 8 and step 9, or step 9 and step 10. The amorphized implantation process, such as the ones described in step 2 and step 7 on the other hand, can be conducted before or after the carbon implantation process. Preferably, the annealing process conducted for forming the lightly doped drain or the source/drain region can be used to re-crystallize the substrate after the amorphized implantation process is performed. Alternatively, an extra annealing process can be performed after the amorphized implantation process to achieve the same effect.

Overall, by conducting a carbon implantation process into the substrate and a corresponding amorphized implantation process before or after the carbon implantation process is completed, the present invention eliminates the need of forming a recess for accommodating an epitaxial layer composed of silicon carbide while facilitates the formation of silicon carbide from the combination of the two implantation processes. Preferably, by injecting atoms smaller than silicon into the substrate during the amorphized implantation process, the present invention is able to prevent phenomenon such as interstitial defects in the polysilicon substrate, which is commonly caused by using larger atoms such as germanium as an amorphized implant. Additionally, by using smaller atoms such as carbon or argon to disorder the polysilicon substrate, the formation of silicon carbide can be facilitated and the tensile strain required for the NMOS transistor can be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating an NMOS transistor, comprising:
    providing a substrate having a gate structure thereon;
    performing a carbon implantation process by implanting carbon atoms into the substrate for forming a silicon carbide region in the substrate;
    forming an n-type source/drain region at two sides of the gate structure;
    forming a metal layer on the NMOS transistor after forming the n-type source/drain region;
    performing rapid thermal annealing process for forming a salicide layer on the NMOS transistor; and
    removing the un-reacted metal layer.

2. The method for fabricating an NMOS transistor of claim 1, wherein the gate structure comprises:
    a gate dielectric ; and
    a gate, disposed on the gate dielectric.

3. The method for fabricating an NMOS transistor of claim 1 further comprising performing an amorphorized implantation process before or after the carbon implantation process.

4. The method for fabricating an NMOS transistor of claim 3 further comprising utilizing carbon, helium, neon, argon, or nitrogen for performing the amorphorized implantation process.

5. The method for fabricating an NMOS transistor of claim 3 further comprising utilizing an energy of 2 KeV to 40 KeV for performing the amorphorized implantation process.

6. The method for fabricating an NMOS transistor of claim 3 further comprising utilizing a concentration of $1\times10^{14}$ atom percent to $1\times10^{16}$ atom percent for performing the amorphorized implantation process.

7. The method for fabricating an NMOS transistor of claim 3 further comprising performing a re-crystallizing annealing process after performing the amorphorized implantation process.

8. The method for fabricating an NMOS transistor of claim 7 further comprising utilizing a temperature of 500° C. to 1100° C. for performing the re-crystallizing annealing process.

9. The method for fabricating an NMOS transistor of claim 1 further comprising utilizing a carbon concentration of 0% to 20% for performing the carbon implantation process.

10. A method for fabricating an NMOS transistor, comprising:
    providing a substrate having a gate structure thereon;
    forming an n-type source/drain region at two sides of the gate structure;
    performing a carbon implantation process by implanting carbon atoms into the substrate for forming a silicon carbide region in the substrate;
    forming a metal layer on the NMOS transistor after forming the n-type source/drain region;
    performing rapid thermal annealing process for forming a salicide layer on the NMOS transistor; and
    removing the un-reacted metal layer.

11. The method for fabricating an NMOS transistor of claim 10, wherein the gate structure comprises:
    a gate dielectric ; and
    a gate, disposed on the gate dielectric.

12. The method for fabricating an NMOS transistor of claim 10 further comprising performing an amorphorized implantation process before or after the carbon implantation process.

13. The method for fabricating an NMOS transistor of claim 12 further comprising utilizing carbon, helium, neon, argon, or nitrogen for performing the amorphorized implantation process.

14. The method for fabricating an NMOS transistor of claim 12 further comprising utilizing an energy of 2 KeV to 40 KeV for performing the amorphorized implantation process.

15. The method for fabricating an NMOS transistor of claim 12 further comprising utilizing a concentration of $1\times10^{14}$ atom percent to $1\times10^{16}$ atom percent for performing the amorphorized implantation process.

16. The method for fabricating an NMOS transistor of claim 12 further comprising performing a re-crystallizing annealing process after performing the amorphorized implantation process.

17. The method for fabricating an NMOS transistor of claim 16 further comprising utilizing a temperature of 500° C. to 1000° C. for performing the re-crystallizing annealing process.

18. The method for fabricating an NMOS transistor of claim 10 further comprising utilizing a carbon concentration of 0% to 20% for performing the carbon implantation process.

* * * * *